(12) United States Patent
Egan et al.

(10) Patent No.: US 9,575,517 B1
(45) Date of Patent: Feb. 21, 2017

(54) REVERSIBLE INPUT/OUTPUT (I/O)

(71) Applicant: NCR Corporation, Duluth, GA (US)

(72) Inventors: Gregory Scott Egan, Flowery Branch, GA (US); Seng Chan, Suwanee, GA (US); Adonis Cala Codera, Cebu (PH); Michael Andrew Kleppinger, Buford, GA (US); Lucky Nino Jalalon Abing, Lapu Lapu (PH)

(73) Assignee: NCR Corporation, Duluth, GA (US)

( * ) Notice: Subject to any disclaimer, the term of this patent is extended or adjusted under 35 U.S.C. 154(b) by 0 days.

(21) Appl. No.: 14/996,595

(22) Filed: Jan. 15, 2016

(51) Int. Cl.
*G06F 1/16* (2006.01)
*G06F 1/18* (2006.01)
*G07F 9/10* (2006.01)
*G07F 7/00* (2006.01)

(52) U.S. Cl.
CPC ............... *G06F 1/181* (2013.01); *G06F 1/187* (2013.01); *G07F 7/005* (2013.01); *G07F 9/10* (2013.01)

(58) Field of Classification Search
CPC ........... G06F 1/181; G06F 1/183; G06F 1/184
See application file for complete search history.

(56) References Cited

U.S. PATENT DOCUMENTS

| | | | | |
|---|---|---|---|---|
| 4,918,572 A * | 4/1990 | Tarver | ........................ | G06F 1/18 361/736 |
| 5,136,468 A * | 8/1992 | Wong | ...................... | G06F 1/184 361/679.6 |
| 5,311,397 A * | 5/1994 | Harshberger | ........... | G06F 1/183 361/679.58 |
| 5,600,538 A * | 2/1997 | Xanthopoulos | ......... | G06F 1/181 361/679.46 |
| 5,717,575 A * | 2/1998 | Copeland | ............. | H05K 7/1429 248/222.11 |
| 5,764,480 A * | 6/1998 | Crump | ..................... | G06F 1/181 312/223.2 |
| 5,774,330 A * | 6/1998 | Melton | ................ | H05K 9/0016 312/223.2 |
| 6,003,008 A * | 12/1999 | Postrel | .................... | G06F 1/183 235/381 |
| 6,053,410 A * | 4/2000 | Wike, Jr. | ................... | G06F 1/16 235/462.43 |
| 6,771,516 B1 * | 8/2004 | Leman | ..................... | G06F 1/184 174/535 |
| 7,016,188 B2 * | 3/2006 | Chen | ........................ | G06F 1/181 174/50 |
| 7,486,505 B2 * | 2/2009 | Fushimi | ..................... | G06F 1/18 361/679.08 |
| 7,566,104 B2 * | 7/2009 | Chen | ........................ | G06F 1/181 312/223.2 |
| 7,639,505 B2 * | 12/2009 | Chen | ........................ | G06F 1/185 312/223.1 |
| 8,009,431 B2 * | 8/2011 | Sun | ......................... | G06F 1/181 361/679.54 |
| 2006/0226743 A1 * | 10/2006 | Chen | ........................ | G06F 1/181 312/223.2 |
| 2009/0267465 A1 * | 10/2009 | Cheng | ................... | H05K 5/0004 312/223.2 |
| 2015/0257297 A1 * | 9/2015 | Sullivan | ................ | G06F 1/1601 312/223.2 |

* cited by examiner

*Primary Examiner* — Anthony Q Edwards
(74) *Attorney, Agent, or Firm* — Schwegman, Lundberg & Woessner (57) ABSTRACT

A reversible I/O apparatus for a POS terminal includes a housing with a motherboard sled removable from the housing to reverse the I/O peripheral ports of the motherboard to a front orientation or a rear orientation.

20 Claims, 12 Drawing Sheets

REVERSIBLE INPUT/OUTPUT (I/O)

BACKGROUND

Point-Of-Sale (POS) terminals are often comprised of: a motherboard, one or more hard drives, and a variety of peripheral ports to interface peripheral devices to the motherboard. The peripheral devices can include such things as: network ports (such as Ethernet), monitors/displays, keyboard, card readers, scanners, cash drawer, receipt printer, camera, PINpad, signature input device, and the like.

The motherboard, hard drive(s), and peripheral ports are provided in a single housing and typically stowed under the cash drawer or somewhere in close proximity to the monitor and/or cash drawer.

Conventionally, the motherboard is designed with a front facing power on and off button and Light Emitting Diode (LED) indicators providing a visual status of what state the motherboard is in, e.g., on, off, working on some activity, etc. The Input/Output (I/O) peripheral ports are located in the rear of the motherboard. This configuration is believed superior so as to hide cabling cords connecting peripherals to the I/O peripheral ports while providing easy front access to the power button and the LED indicators.

However, in practice, the housing of the motherboard is usually placed on a shelf or in a cabinet with little available physical space to spare, such that removing the housing for service requires pulling the housing with attached cables entirely out of the cabinet or enclosure to access the I/O peripheral ports and associated cabling. In some situations this requires substantial physical dexterity to hold the housing with one hand while trying to disconnect one or more cables or attach a new cable to the I/O peripheral ports with the remaining hand. Moreover, a POS terminal's motherboard housing can have many cables attached, such that trying to figure out what cable goes where after disconnecting the cables can be problematic.

The time it takes to actually remove the housing from is enclosure or cabinet can also be more than a normal service operation (i.e., upgrading Random Access Memory (RAM), checking internal motherboard components, removing internal dust, etc.). Many retail stores can have hundreds of POS terminals, in integration trays that require annual preventive maintenance service. The time it takes a service engineer to just access the POS terminals for service is a significant percentage of total service time.

SUMMARY

In various embodiments, reversible I/O apparatuses for a POS terminal, a method of reversing I/O within an apparatus, and a POS terminal having the reversible I/O apparatus are provided.

According to an embodiment, a reversible I/O apparatus is presented, comprising: a motherboard attached to a sled; and a housing encasing the sled. The sled is attached to the housing and oriented with Input/Output (I/O) peripheral ports oriented to a front of the housing with the power button and status indicator light.

DETAILED DESCRIPTION

Figure 1A:
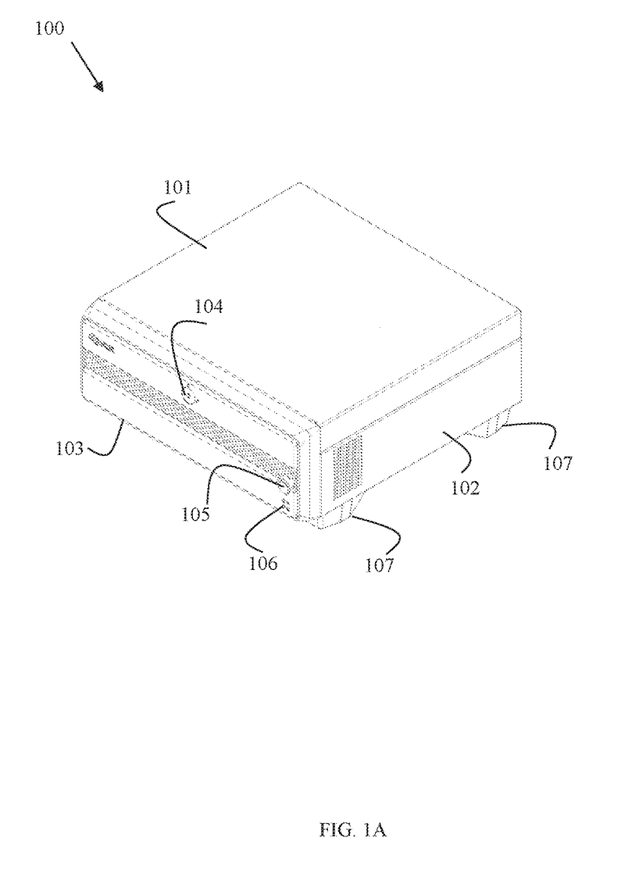
FIG. 1A is a diagram depicting a covered reversible I/O apparatus oriented to depict the front, top, and one side of the reversible I/O apparatus, according to an example embodiment.

FIG. 1A is a diagram depicting a covered reversible I/O apparatus 100 oriented to depict the front, top, and one side of the reversible I/O apparatus, according to an example embodiment. It is to be noted that the configuration is shown schematically in greatly simplified form, with only those components relevant to understanding of this embodiment being illustrated.

The reversible I/O apparatus 100 depicted in the FIG. 1A shows a top cover 101, one or two sides 102, a front bezel cover 103, a turn knob 104 to remove (unlock) the front bezel cover 103 from the housing of the apparatus 100 or to close and lock the front bezel cover 103 onto the housing of the apparatus 100, a power button 105, LED status indicator lights 106, and legs 107 (two of four legs 107 shown in the FIG. 1A.

The FIG. 1A illustrates a POS terminal (without attached peripherals: card reader, keyboard, display, receipt printer, signature pad, scanner, cash drawer. PIN pad, etc.) as it is viewed from its front user-facing orientation. This is the orientation that the reversible I/O apparatus 100 is in when accessed (via the power button) by an operator to power the POS terminal on and off. This is also the orientation that a service engineer would encounter when first accessing the reversible I/O apparatus 100 for service in a cabinet/enclosure.

Figure 1B:
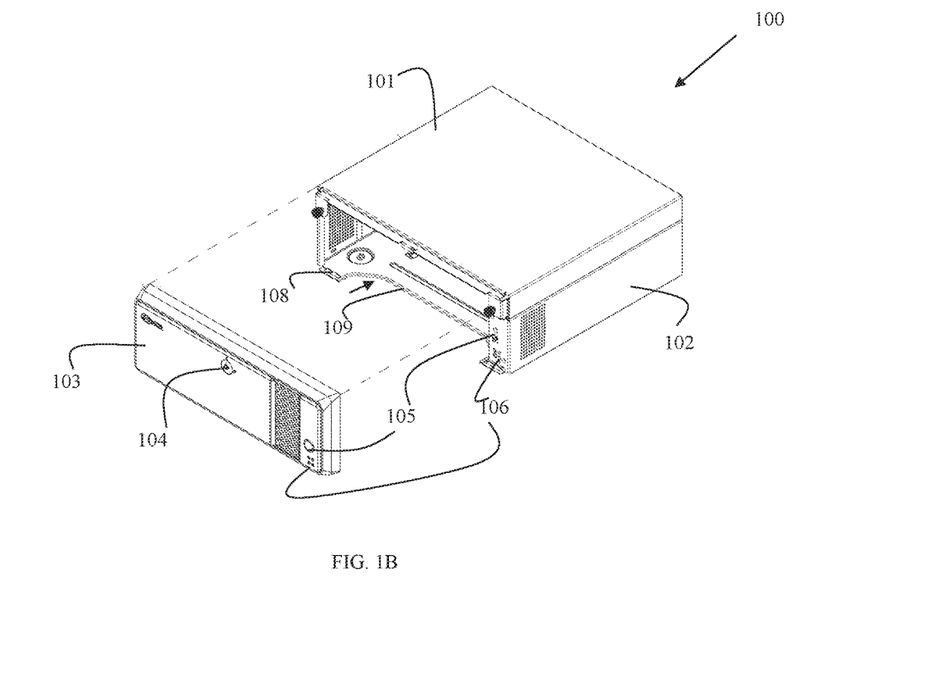
FIG. 1B is a diagram depicting the reversible I/O apparatus housing with the front bezel cover removed and no motherboard installed in the housing, according to an example embodiment.

FIG. 1B is a diagram depicting the reversible I/O apparatus housing 100 with the front bezel cover removed and no motherboard installed in the housing 100, according to an example embodiment.

In the FIG. 1B, the turn knob 104 has been turned counter clockwise (can also be clockwise) to unlock the front bezel cover 103 from the housing exposing the inner cabinet of the housing 100 (which is empty in FIG. 1B for illustrative purposes).

In an embodiment, the bezel 103 includes a reinforced steel plate on an inside portion of the bezel 103 (the portion facing the I/O peripheral ports 110 when front-facing). This provides structural rigidity to the bezel 103 when pushed against cabling connected to the I/O peripheral ports 110).

The front bezel cover 103 includes slots through which the power button 105 and LED status indicators 106 protrude for user access and user visibility. The power button 105 and LED status indicators 106 are integrated into a modular card on a front lip of the front of the housing 100 and interfaced to the motherboard via cabling. As will be discussed more completely herein and below the power button 105 and the LED status indicators 106 remain fixed in a front-facing orientation within the housing 100 irrespective of whether the I/O peripheral ports are front-facing or rear-facing within the housing 100.

The housing 100 also shows a recessed curved portion 109 of the front-facing bottom of the housing 100 along with extended portion 108 of the front-facing bottom of the housing 100. This creates a gap between the bottom of the front bezel 103 and the front-facing bottom of the housing when the bezel 103 is in a closed position and locked onto the housing 100. In an embodiment, the gap is between 1-2 inches and forms a trapezoid shaped hole when the housing is assembled as shown in the FIG. 1A (not visible in the FIG. 1A).

The gap permits cabling to run underneath the housing when the reversible I/O apparatus 100 is oriented with the I/O peripheral ports in a front-facing orientation/configuration. The legs 107 as shown in the FIG. 1A also create a space underneath the housing for the cabling to run back to the rear of the reversible I/O apparatus 100 for connection to the peripheral devices. In an embodiment, the height of the legs create about an inch to an inch and a half gap under the reversible I/O apparatus 100. In an embodiment, the legs are removable, if desired, to decrease the height of the reversible I/O apparatus 100 (this would be when the I/O peripheral ports are in a rear-facing orientation/configuration).

The directional arrow in the FIG. 1B (and subsequent figures) is intended to illustrate the recession and gap created by the offset of 108 and 109 and manufactured into the base of the bottom of the housing 100.

Figure 1C:
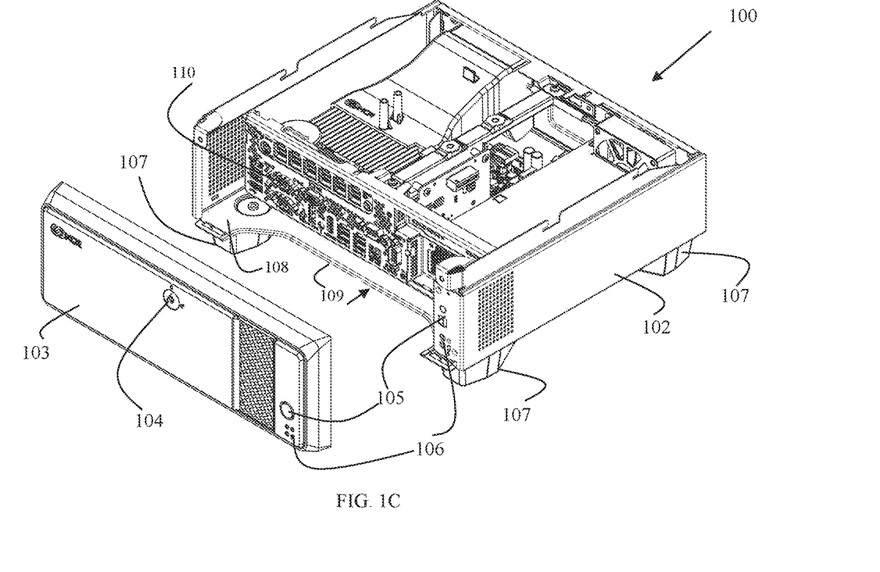
FIG. 1C is a diagram depicting the reversible I/O apparatus with the top cover and front bezel cover removed with an installed motherboard showing the I/O ports to the motherboard with a front orientation, according to an example embodiment.

FIG. 1C is a diagram depicting the reversible I/O apparatus 100 with the top cover and front bezel cover removed with an installed motherboard showing the I/O ports to the motherboard with a front orientation, according to an example embodiment.

In the FIG. 1C, the motherboard is oriented within the reversible I/O apparatus 100 such that the I/O peripheral ports 110 are front-facing.

In this configuration, all the I/O peripheral ports 110 are accessible to a server engineer by removing the front bezel 103 without removing the entire reversible I/O apparatus 100 from its enclosure and possibly disconnecting cabling to the I/O peripheral ports 110 in the process. When cabling is connected, it can be removed if needed and laid on the surface that the reversible I/O apparatus 100 rests in line with the specific ports 110 to which the removed cabling was originally connected. This improves servicing of the reversible I/O apparatus 100 and can be done within the enclosure where the reversible I/O apparatus 100 is natively stowed. The cabling runs under the reversible I/O apparatus 100 in the space created by the legs 107 and behind the bezel 103 in the gap created by recessed portion 109.

Figure 1D:
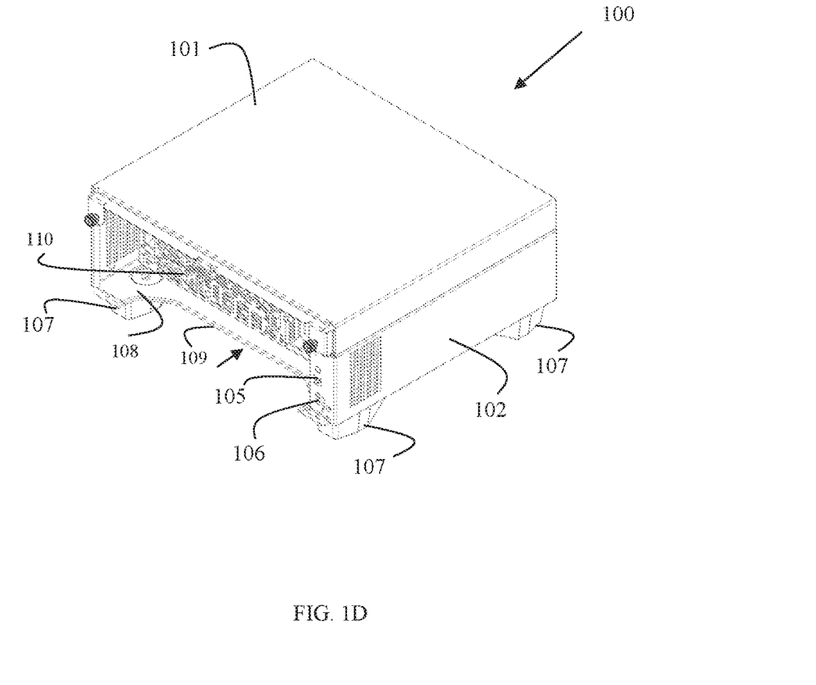
FIG. 1D is a diagram depicting the reversible I/O apparatus with the front bezel cover removed with an installed motherboard showing the I/O ports to the motherboard with a front orientation, according to an example embodiment.

FIG. 1D is a diagram depicting the reversible I/O apparatus 100 with the front bezel cover removed with an installed motherboard showing the I/O ports to the motherboard with a front orientation, according to an example embodiment.

The FIG. 1D shows the front-facing I/O peripheral port 110 orientation with the top cover 101 installed on the reversible I/O apparatus 100.

Figure 1E:
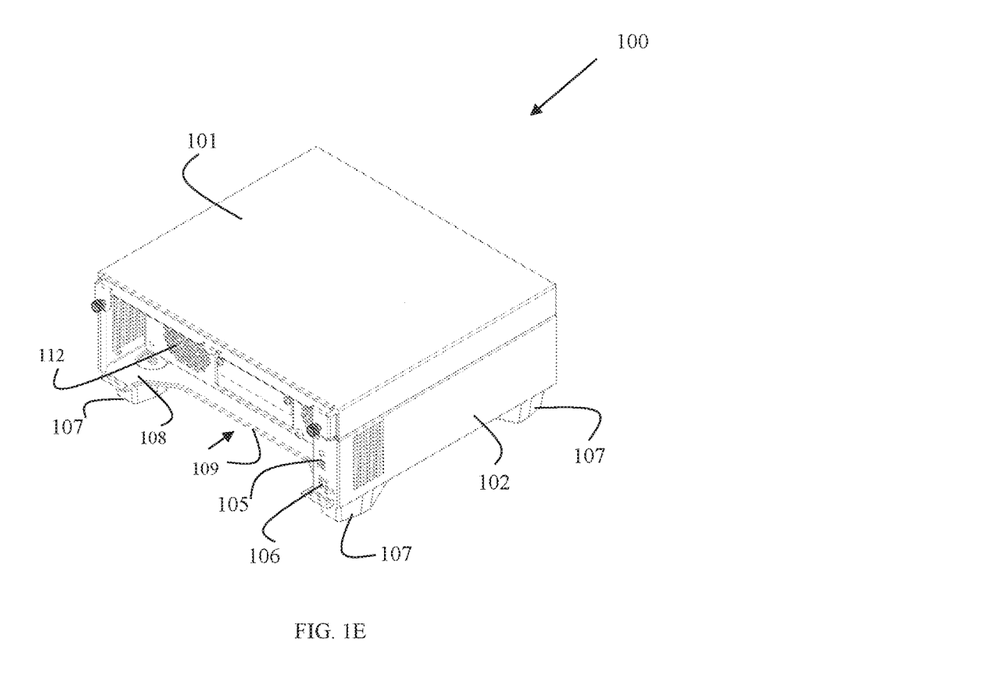
FIG. 1E is a diagram depicting the reversible I/O apparatus with the front bezel cover removed with an installed motherboard showing the fan portion of the motherboard with a front orientation, according to an example embodiment.

FIG. 1E is a diagram depicting the reversible I/O apparatus 100 with the front bezel cover removed with an installed motherboard showing the fan portion of the motherboard with a front orientation, according to an example embodiment.

The FIG. 1E shows the fan portion 112 of the motherboard in a front-facing orientation. Here, the I/O peripheral ports 110 are in a rear-facing orientation (a traditional orientation).

Figure 1F:
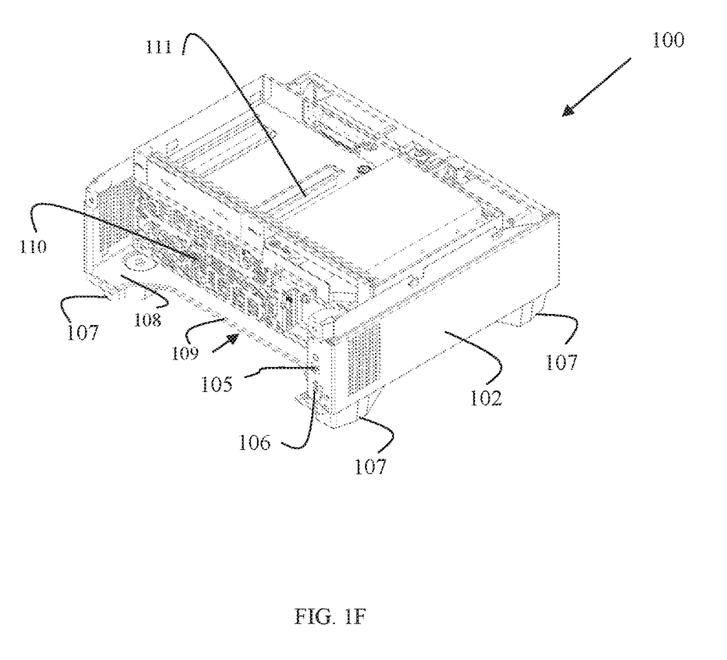
FIG. 1F is a diagram depicting the reversible I/O apparatus with the top cover and the front bezel cover removed with an installed motherboard showing the I/O ports to the motherboard with a front orientation and showing a stacked installed orientation of the hard drive, according to an example embodiment.

FIG. 1F is a diagram depicting the reversible I/O apparatus 100 with the top cover and the front bezel cover removed with an installed motherboard showing the I/O ports to the motherboard with a front orientation and showing a stacked installed orientation of the hard drive, according to an example embodiment.

The FIG. 1F shows the front-facing I/O peripheral ports of the motherboard in a front-facing orientation with the installed hard drive 111.

Figure 1G:
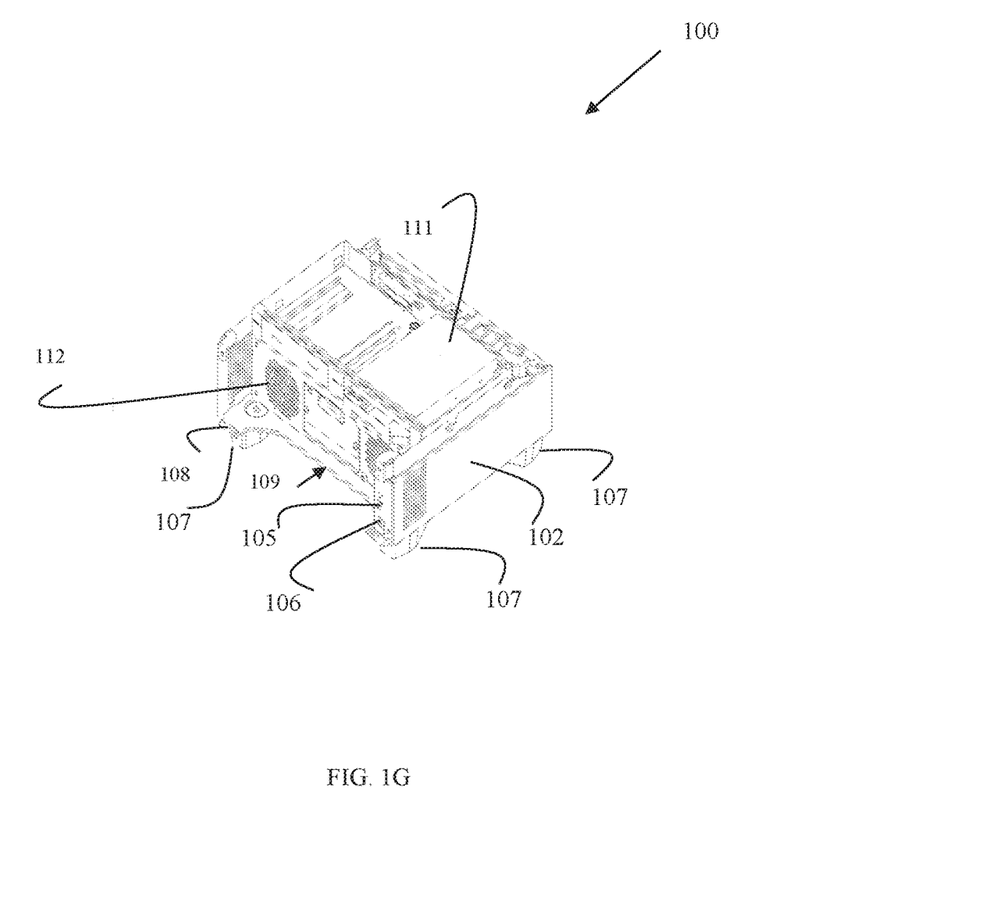
FIG. 1G is a diagram depicting the reversible I/O apparatus with the top cover and the front bezel cover removed with an installed motherboard showing the fan portion of the motherboard with a front orientation and showing a stacked installed orientation of the hard drive, according to an example embodiment.

FIG. 1G is a diagram depicting the reversible I/O apparatus 100 with the top cover and the front bezel cover removed with an installed motherboard showing the fan portion of the motherboard with a front orientation and showing a stacked installed orientation of the hard drive, according to an example embodiment.

The FIG. 1G shows the fan portion 112 of the motherboard in a front-facing orientation with the installed hard drive 111.

It is noted that in either orientation fan-portion 112 front-facing or I/O peripheral ports 110 front facing, the hard drive 111 is always front facing for ease of access when the bezel 103 is removed from the reversible I/O apparatus 100.

Figure 1H:
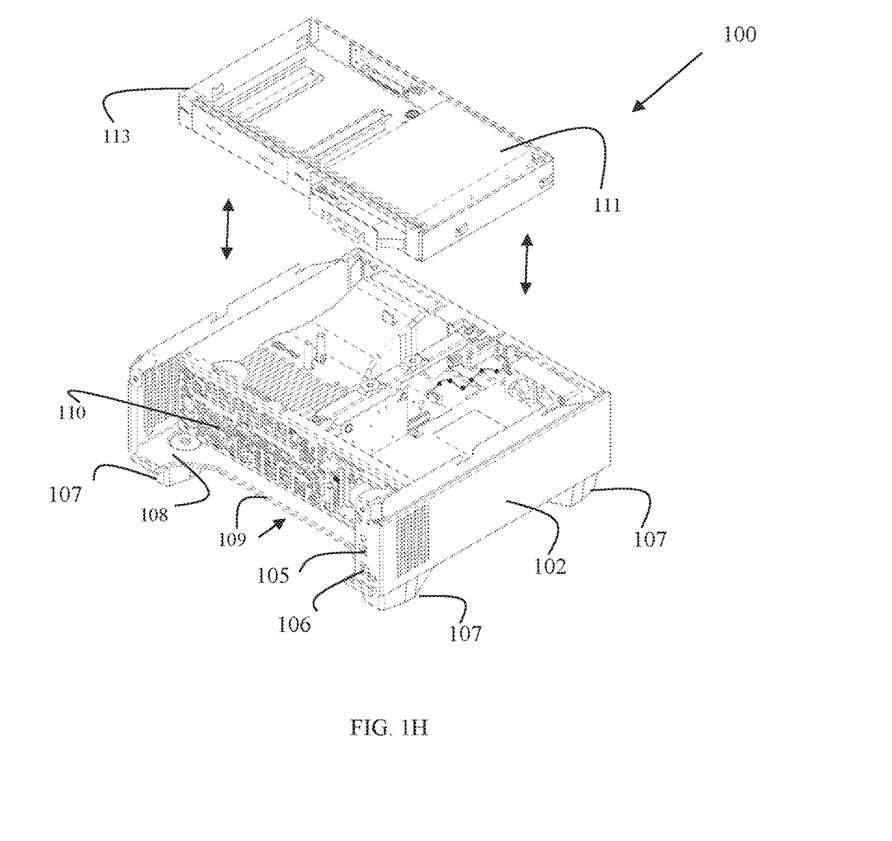
FIG. 1H is a diagram depicting the reversible I/O apparatus with the top cover and the front bezel cover removed with an installed motherboard showing the I/O ports to the motherboard with a front orientation and showing removal of the hard drive tray, according to an example embodiment.

FIG. 1H is a diagram depicting the reversible I/O apparatus 100 with the top cover and the front bezel cover removed with an installed motherboard showing the I/O ports to the motherboard with a front orientation and showing removal of the hard drive tray, according to an example embodiment.

The FIG. 1H illustrates that the hard drive 111 includes its own removable tray 113 from the reversible I/O apparatus 100 that stacks on top of the motherboard. This permits the hard drive 111 to always be front-facing regardless of whether the reversible I/O apparatus 100 is in an I/O peripheral port 110 front-facing orientation or in a fan portion 112 front-facing orientation within the reversible I/O apparatus 100. Cabling permits the port on the hard drive to connect to the proper port on the motherboard underneath the removable tray 113. The removable tray 113 adapted to be removed and repositioned to ensure the hard drive 111 is always front-facing.

Figure 1I:
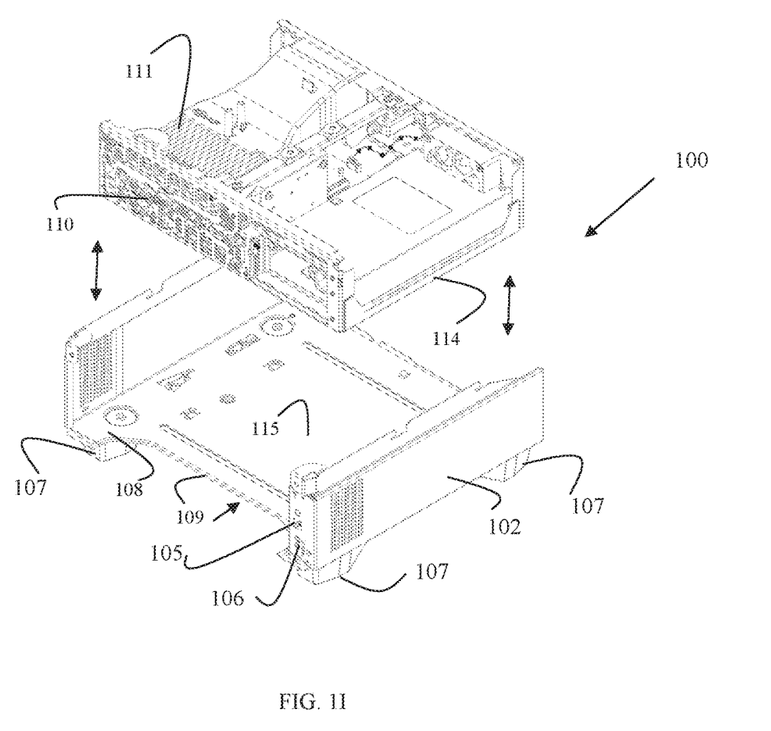
FIG. 1I is a diagram depicting the reversible I/O apparatus with the top cover and the front bezel cover removed with removal of motherboard sled/tray and showing the I/O ports to the motherboard with a front orientation when the motherboard sled/tray is removed from the housing, according to an example embodiment.

FIG. 1I is a diagram depicting the reversible I/O apparatus 100 with the top cover and the front bezel cover removed with removal of motherboard sled/tray and showing the I/O ports to the motherboard with a front orientation when the motherboard sled/tray is removed from the housing, according to an example embodiment.

In the FIG. 1I the motherboard resides on a sled/tray 114 that is removable from a base 115 of the housing of the reversible I/O apparatus 100. The sled 114 can then be orientated to have front-facing I/O peripheral ports 110 or to have the fan portion 112 front-facing.

Figure 1J:
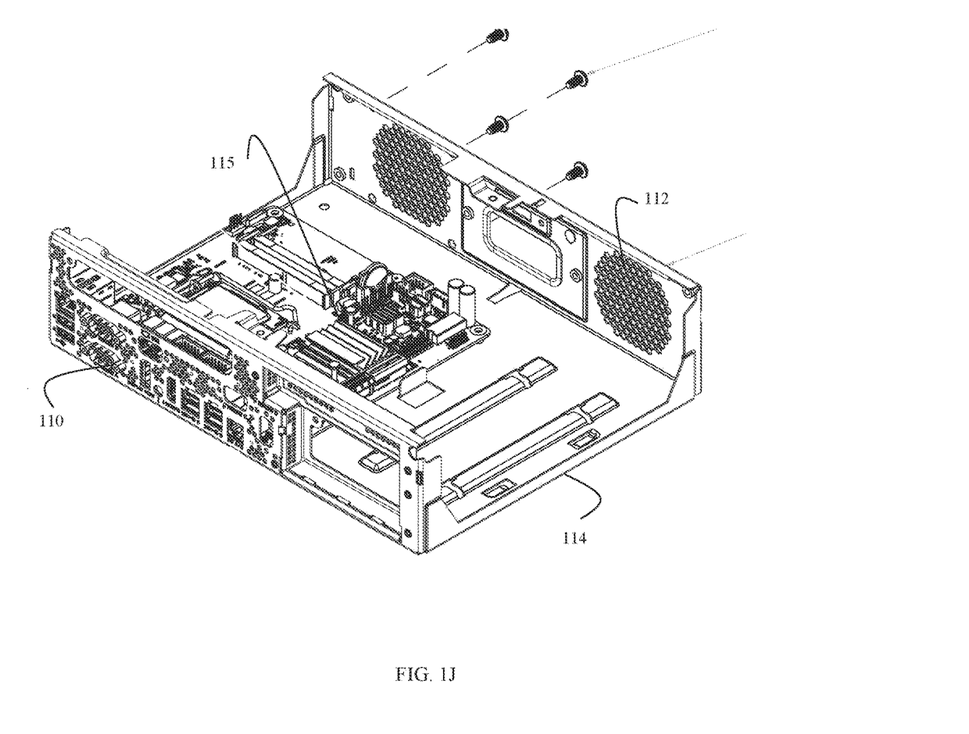
FIG. 1J is a diagram depicting the motherboard sled/tray independent of the housing, according to an example embodiment.

FIG. 1J is a diagram depicting the motherboard sled/tray 114 independent of the housing, according to an example embodiment.

The sled 114 of the motherboard is completely removable from the reversible I/O apparatus 100 for achieving a desired orientation for the I/O ports 110 (front-facing or rear-facing). The top of the sides of sled includes holes that permit the card for the power button 105 and LED indicators 106 to connect via cabling within the housing to the proper ports 110 when the reversible I/O apparatus 100 has the ports 110 oriented in a rear-facing configuration.

In an embodiment, the reversible I/O apparatus 100 is integrated within and part of a POS terminal.

With the I/O peripheral ports 110 facing forward, accessing the I/O ports 110 for additional cables, removal or servicing existing cabling is much easier. When the POS terminal (motherboard housing) is removed from the cabinet or enclosure, the cables are facing the service engineer or customer. Therefore, there is no need to access the rear of the cabinet or enclosure. Once the cables are disconnected, they are simply laid down in place. There is no need to re-position the cable nor add or remove cable slack. The terminal slides out of the enclosure or cabinet over the cables. Thus, the time required to remove the terminal from the enclosure is much less than if the I/O ports 110 was rear-facing. Also, the risk of damaging the cables or connectors on the motherboard is significantly minimized from a conventional rear-facing I/O orientation. There is no need to pull the terminal with multiple connected cables and stress the motherboard connectors, such as when the I/O is in a rear-facing orientation. Risk of dropping the terminal is minimized as well since both hands can now be used to remove the terminal without trying to use one hand to disconnect cables in the rear of the terminal.

One now appreciates how a POS terminal's motherboard housing can have a reversible I/O port orientation depending on each installation need. This improves servicing and customer satisfaction while maximizing space utilization within a housing for the motherboard and hard drive(s) and without substantially impacting the overall size and dimensions of the housing itself.

These and other embodiments are now discussed with reference to the FIGS. 2-3.

Figure 2:
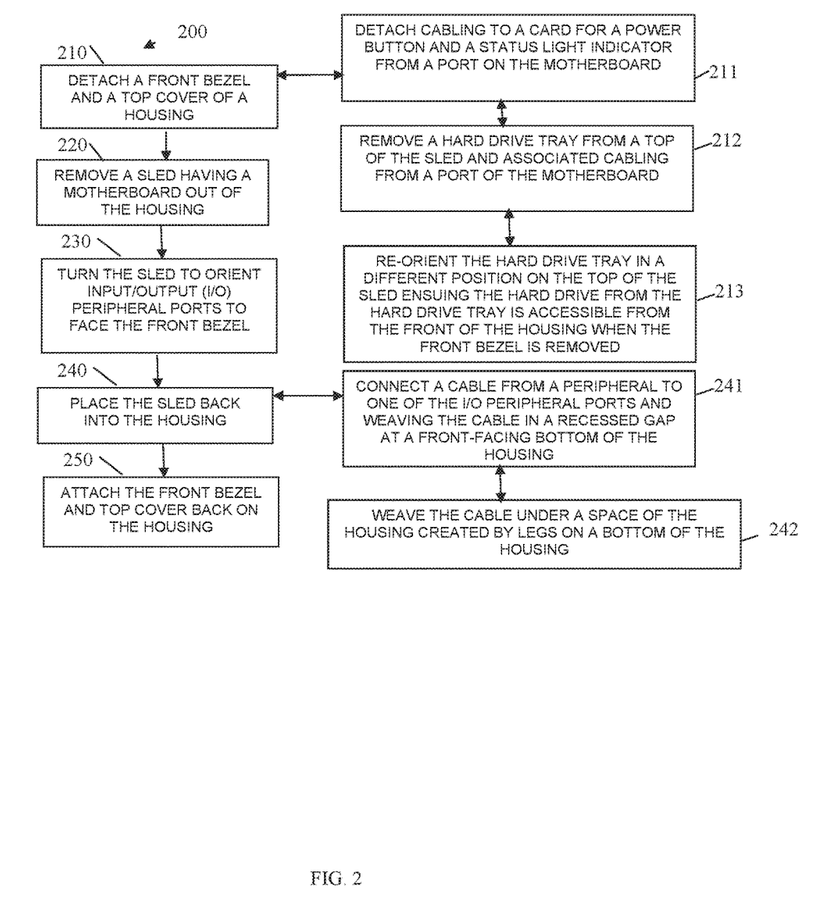
FIG. 2 is a diagram of a method for reversing I/O for a reversible I/O apparatus, according to an example embodiment.

FIG. 2 is a diagram of a method 200 for reversing I/O for a reversible I/O apparatus, according to an example embodiment.

In an embodiment, the I/O reversible I/O apparatus is the I/O reversible apparatus 100 of the FIGS. 1A-1J.

In an embodiment, the I/O reversible apparatus is part of and integrated within a POS terminal.

At 210, a front bezel and a top cover is removed from a housing having a motherboard and a plurality of I/O peripheral ports.

In an embodiment, at 211, detaches cabling to a card for a power button and a status light indicator from a port on the motherboard.

In an embodiment, at 212, a hard drive tray having a hard drive is removed from a top of the sled (discussed below at 220) and associated cabling is removed from a port of the motherboard.

In an embodiment of 212 and at 213, the hard drive tray is re-oriented in a different position on the top of the sled ensuring the hard drive from the hard drive tray is accessible from the front of the housing when the front bezel is removed.

At 220, a sled is removed out of the housing where the sled includes the motherboard.

At 230, the sled is turned to orient I/O peripheral ports to face the front bezel or where the front bezel was removed from the housing.

At 240, the sled is placed back into the housing.

In an embodiment, at 241, a cable is connected from a peripheral to one of the I/O peripheral ports and the cable is weaved in a recessed gap at a front-facing bottom of the housing.

In an embodiment of 241 and at 242, the cable is further weaved under a space of the housing created by legs on a bottom of the housing.

At 250, the front bezel and top cover is attached back on the housing.

Figure 3:
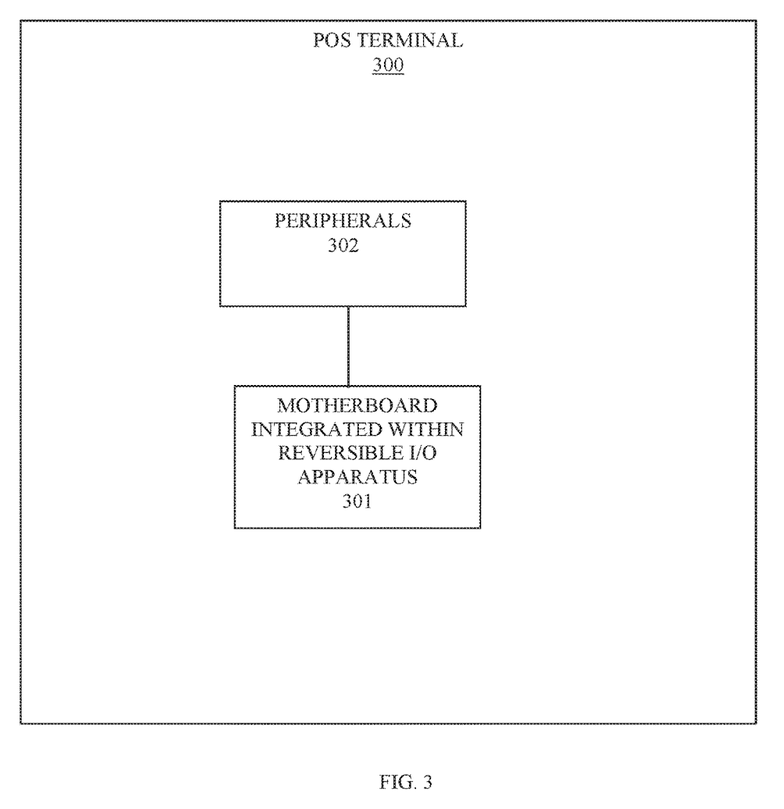
FIG. 3 is a diagram of POS terminal having the reversible I/O apparatus, according to an example embodiment.

FIG. 3 is a diagram of POS terminal 300 having the reversible I/O apparatus, according to an example embodiment.

The POS terminal 300 includes at least one peripheral 302 and a motherboard integrated within a reversible I/O apparatus 302.

In an embodiment, the peripherals 301 include one or more of: a magnetic card reader, a keyboard, a signature pad, a cash drawer, a monitor/display, a touchscreen, a scanner, a printer, a receipt printer, a disk drive, a network device, and the others.

In an embodiment, the reversible I/O apparatus 302 is the reversible I/O apparatus 110 of the FIGS. 1A-1J.

In an embodiment, the reversible I/O apparatus 302 is the revisable I/O apparatus discussed above with the FIG. 2.

The motherboard integrated within the reversible I/O apparatus 302 is adapted to be oriented to a front of the housing for the motherboard where a power button and a status indicator are located.

In an embodiment, the I/O apparatus 302 is adapted to be removed from the housing.

In an embodiment of the latter embodiment, the I/O apparatus 302 is further adapted to be placed back in the housing with the I/O apparatus 302 facing a rear of the housing.

The above description is illustrative, and not restrictive. Many other embodiments will be apparent to those of skill in the art upon reviewing the above description. The scope of embodiments should therefore be determined with reference to the appended claims, along with the full scope of equivalents to which such claims are entitled.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Description of the Embodiments, with each claim standing on its own as a separate exemplary embodiment.

The invention claimed is:

1. An apparatus, comprising:
   a motherboard attached to a sled; and
   a housing encasing the sled;
   wherein the sled is attached to the housing and oriented with Input/Output (I/O) peripheral ports oriented to a front of the housing with the power button and status indicator light.

2. The method of claim 1, wherein the sled is adapted to be removed from the housing and oriented to a rear of the housing opposite the power button and the status indicator light.

3. The method of claim 1, wherein a front-facing bottom of the housing includes a gap between a front bezel of the housing and the front-facing bottom, the gap adapted to allow cables to run from the I/O ports to a rear of the housing.

4. The method of claim 3, wherein the apparatus further includes legs attached to a bottom of the housing creating a space adapted to allow the cables to run under the housing to the rear of the housing.

5. The method of claim 4, wherein the legs are adapted to be removed from the bottom of the housing when the sled is removed and the I/O peripheral ports are oriented to the rear of the housing.

6. The method of claim 1, wherein the apparatus further includes a card slot in a front-side portion of the housing adapted for interfacing the power button and the status indicator light.

7. The method of claim 6, wherein top sides of the sled include a hole adapted to run an interface cable from the card to a specific I/O peripheral port in the rear of the housing when the sled is removed and the I/O peripheral ports are oriented to the rear of the housing.

8. The method of claim 1, wherein the apparatus includes a hard drive port integrated into a tray, the tray adapted to be placed on top of the sled and under a top cover of the housing.

9. The method of claim 8, wherein the tray is adapted to be removed from the sled and oriented for access from the front of the housing when the I/O peripheral ports are oriented to the front and when the I/O peripheral ports are oriented to a rear of the housing.

10. The method of claim 1, wherein housing includes a removable bezel from the front of the housing having a single knob to remove the bezel from the housing and to lock the bezel to the housing.

11. The method of claim 1, wherein an inside of the bezel includes a reinforced steel plate adapted to provide rigidity against cables connected to the I/O peripheral ports.

12. A method, comprising:
    detaching a front bezel and a top cover of a housing;
    removing a sled having a motherboard out of the housing;
    turning the sled to orient Input/Output (I/O) peripheral ports to face the front bezel;
    placing the sled back into the housing; and
    attaching the front bezel and top cover back on the housing.

13. The method of claim 12, wherein detaching further includes detaching cabling to a card for a power button and a status light indicator from a port on the motherboard.

14. The method of claim 12, wherein detaching further includes removing a hard drive tray from a top of the sled and associated cabling from a port of the motherboard.

15. The method of claim 14, wherein the detaching further includes re-orienting the hard drive tray in a different position on the top of the sled ensuing the hard drive from the hard drive tray is accessible from the front of the housing when the front bezel is removed.

16. The method of claim 12, wherein placing further includes connecting a cable from a peripheral to one of the I/O peripheral ports and weaving the cable in a recessed gap at a front-facing bottom of the housing.

17. The method of claim 16, wherein connecting further includes weaving the cable under a space of the housing created by legs on a bottom of the housing.

18. A Point-Of-Sale (POS) terminal, comprising:
    at least one peripheral; and
    a motherboard integrated within a reversible Input/Output (I/O) apparatus that is adapted to be oriented to a front of a housing for the motherboard where a power button and a status indicator are located.

19. The POS terminal of claim 18, wherein I/O apparatus is adapted to be removed from the housing.

20. The POS terminal of claim 19, wherein I/O apparatus is adapted to be placed back in the housing with the I/O apparatus facing a rear of the housing.

* * * * *